(12) United States Patent
Kim (10) Patent No.: US 8,416,357 B2
(45) Date of Patent: Apr. 9, 2013

(54) DISPLAY DEVICE AND METHOD THEREOF

(75) Inventor: Dong-Gyu Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/589,402

(22) Filed: Aug. 20, 2012

(65) Prior Publication Data

US 2012/0313121 A1 Dec. 13, 2012

Related U.S. Application Data

(62) Division of application No. 12/338,212, filed on Dec. 18, 2008, now Pat. No. 8,274,617.

(30) Foreign Application Priority Data

Aug. 19, 2008 (KR) .................. 10-2008-0081014

(51) Int. Cl.
  *G02F 1/1343* (2006.01)
  *G02F 1/1337* (2006.01)
(52) U.S. Cl. .......................... 349/39; 349/38; 349/129
(58) Field of Classification Search .............. 349/38–39, 349/129
See application file for complete search history.

(56) References Cited

U.S. PATENT DOCUMENTS

| 6,784,949 | B1 | 8/2004 | Nagata et al. |
| 7,936,407 | B2 * | 5/2011 | Kim et al. ........................ 349/39 |
| 7,948,588 | B2 * | 5/2011 | Yang et al. ..................... 349/114 |
| 2002/0113913 | A1 * | 8/2002 | Okada et al. .................... 349/39 |
| 2006/0170835 | A1 | 8/2006 | Jun et al. |

FOREIGN PATENT DOCUMENTS

| JP | 2006-276432 | 10/2006 |
| KR | 1999-003712 | 1/1999 |
| KR | 1020070070405 A | 7/2007 |
| KR | 1020080002220 A | 1/2008 |

* cited by examiner

Primary Examiner — Nathanael R Briggs
(74) Attorney, Agent, or Firm — Cantor Colburn LLP (57) ABSTRACT

A display device includes a pixel electrode disposed on a first substrate, and including a first portion, a second portion and a connection portion disposed between the first portion and the second portion, a capacitor line disposed on the first substrate and between the first substrate and the connection portion, a nonsymmetrical shaped capacitor electrode disposed on the first substrate and overlapping the pixel electrode and the capacitor line, and electrically connected to the pixel electrode through contact holes, and a common electrode disposed on a second substrate and including first and second opening patterns disposed overlapping the first portion and the second portion of the pixel electrode, respectively.

8 Claims, 9 Drawing Sheets

DISPLAY DEVICE AND METHOD THEREOF

This application is a divisional application of U.S. application Ser. No. 12/338,212 filed Dec. 18, 2008, which claims priority to Korean Patent Application No. 10-2008-0081014, filed on Aug. 19, 2008, and all the benefits accruing therefrom under §119, the contents of which are herein incorporated by reference in its entirety.

BACKGROUND OF THE INVENTION

1. Field of the Invention

The present invention relates to a display device. More particularly, the present invention relates to a liquid crystal display ("LCD") device capable of improving viewing angles.

2. Description of the Related Art

A LCD device can change the arrangement of liquid crystal molecules interposed between two substrates, in response to an electric field applied thereto, and display images. An image quality of a LCD device depends on viewing angles due to arrangement of liquid crystal molecules. A LCD device is able to display good images within a particular range of viewing angles which have a contrast ratio of more than 10:1. A display device for a desktop monitor, for example, has a viewing angle of greater than 90 degrees.

The contrast ratio is a measure of a display system, defined as the ratio of the luminance of the brightest color (e.g., white) to that of the darkest color (e.g., black) that the system is capable of producing. When a LCD device is able to display a darker and/or a brighter color than a color that a common system is capable of producing, the contrast ratio is increased. In order to display the darker color, a LCD device may decrease the light leakage of a LCD panel, adopt a normally black mode and/or decrease the reflectivity of a black matrix. Conversely, in order to display the brighter color, a LCD device may be designed to have a high aperture ratio for illuminating more light from a backlight.

Viewing angles according to azimuthal angles, having the specific contrast ratio, may be enhanced by a compensation film and/or multi-domains. A wide viewing angle mode, such as a multi-domain vertical alignment ("MVA") mode and a patterned vertical alignment ("PVA") mode, has been developed in order to improve the viewing angles according to azimuthal angles in aspect of multi-domains.

BRIEF SUMMARY OF THE INVENTION

Since a wide viewing angle mode, such as a MVA mode and a PVA mode, has been developed in order to improve the viewing angles according to azimuthal angles in aspect of multi-domains, there may be disadvantages in the manufacturing and/or structure of an LCD device. For example, in order to adopt a MVA mode, protrusions are formed on electrodes of two substrates to form multi-domains in a liquid crystal layer. A manufacturing cost of a LCD device for a MVA mode is disadvantageously increased because of an additional forming process for protrusions. As a further example, in order to adopt a PVA mode, linear slits are formed in electrodes of two substrates. The arrangement of liquid crystal molecules disposed on the linear slits, however, may not be controlled sufficiently so that an aperture ratio of a LCD device is disadvantageously decreased.

As a further disadvantage, when a relatively small sized LCD device adopts the PVA mode, the aperture ratio of the small sized LCD device is greatly decreased, so that the luminance of a small sized LCD device is also decreased. Thus, for the small sized LCD device, the LCD device development for wide viewing angles, without the additional forming process and/or the reduction of an aperture ratio, is desired.

An exemplary embodiment of the present invention provides a display capable of enhancing viewing angles.

An exemplary embodiment of the present invention provides a display device including a pixel electrode disposed on a first substrate and including a first portion, a second portion and a connection portion disposed between the first and second portions, the connection portion being continuous with the first and second portions, a capacitor line disposed on the first substrate and between the first substrate and the connection portion, a capacitor electrode disposed on the first substrate and in substantially dumbbell island type shape, overlapping the pixel electrode and the capacitor line, and electrically connected to the pixel electrode through contact holes, and a common electrode disposed on a second substrate and including a first opening pattern and a second opening pattern overlapping the first portion and the second portion of the pixel electrode, respectively.

The first and second opening patterns may be arranged overlapping an entire of the contact holes An exemplary embodiment of the present invention provides a display device including a first substrate, a switch element disposed on the first substrate, a pixel electrode disposed on the first substrate and including a first portion, a second portion and a connection portion disposed between the first and second portions, and electrically connecting the first portion with the second portion, a capacitor line disposed on the first substrate and between the first substrate and the connection portion of the pixel electrode, a first capacitor electrode disposed on the first substrate substantially in a nonsymmetrical shape in a plan view, overlapping the pixel electrode, a second capacitor electrode disposed on the first substrate, overlapping the first capacitor electrode and electrically connected to the capacitor line, an insulating layer including a first contact hole and a second contact hole, the insulating layer disposed between the switch element and the pixel electrode, and the first capacitor electrode and the pixel electrode, a second substrate, and a common electrode disposed on the second substrate and including a first opening pattern and a second opening pattern disposed overlapping the first portion and the second portion of the pixel electrode, respectively. The pixel electrode is electrically connected to a terminal of the switch element through the first contact hole, and to the first capacitor electrode through the second contact hole.

Both of the first and second opening patterns may be arranged overlapping a single one of the first contact hole or the second contact hole.

The insulating layer may further include a third contact hole to electrically connect the pixel electrode to the first capacitor electrode. The first and the second contact hole are arranged overlapping the first portion of the pixel electrode, while the third contact hole is arranged overlapping the second portion of the pixel electrode. The second contact hole and the third contact hole are arranged overlapping the first and second opening patterns, respectively.

Both of the first contact hole and the second contact hole may be arranged overlapping a single one of the first opening pattern, or the second opening pattern.

The connection portion of the pixel electrode is extended substantially parallel to a longitudinal direction of the first capacitor electrode.

The display device may further include an organic insulation pattern disposed on the first substrate and directly contacting a lower surface of the pixel electrode. The organic insulation pattern may be a color filter.

The display device may further include a pad electrically connected to the switch element and transmitting a signal to the switch element, an auxiliary pad connected to the pad through a pad contact hole and an auxiliary pattern disposed surrounding the pad contact hole.

The first capacitor electrode may include a first extension part and a second extension part overlapping with the first and second portions of the pixel electrode, respectively. The second and third contact holes are arranged overlapping the first extension part and the second extension part, respectively.

The first capacitor electrode and the second capacitor electrode may be substantially the same shape, in a plan view.

The first capacitor electrode may be a nonsymmetrical dumbbell shape of an island type.

An exemplary embodiment of the present invention provides a method of manufacturing a display device. The method includes forming a capacitor line and a gate line including a gate electrode on a substrate, forming an gate insulating layer on the gate line and the capacitor line, forming a semiconductor pattern on the gate insulating layer, forming a first capacitor electrode, a source electrode, and a data line including a data electrode and a data pad on the semiconductor pattern and the gate insulating layer, forming a protection layer on the first capacitor electrode, the source electrode, and the data line, forming a first organic insulating pattern including a first portion disposed around the data pad and a second portion thicker in a direction substantially perpendicular to the substrate than the first portion and exposing a portion of the protection layer; etching the protection layer with using the first organic insulating pattern as a mask to form a plurality of contact holes, etching the first organic insulating pattern until the first portion removed thereby to form a second organic insulating pattern, and forming a pixel electrode on the second organic insulating pattern and a auxiliary pad on the protection layer.

The forming a first capacitor electrode, a source electrode, and a data line may include forming a gate pad, and wherein the forming a pixel electrode may include forming a bridge conductive pattern connecting the gate pad and the gate line.

BRIEF DESCRIPTION OF THE DRAWINGS

The accompanying drawings briefly described below illustrate exemplary embodiments of the present invention and, together with the description, serve to explain the principles of the present invention.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" "connected to" another element or layer, the element or layer can be directly on, connected or coupled to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

The present invention will now be described more fully hereinafter with reference to the accompanying drawings, in which exemplary embodiments of the invention are shown.

Figure 1:
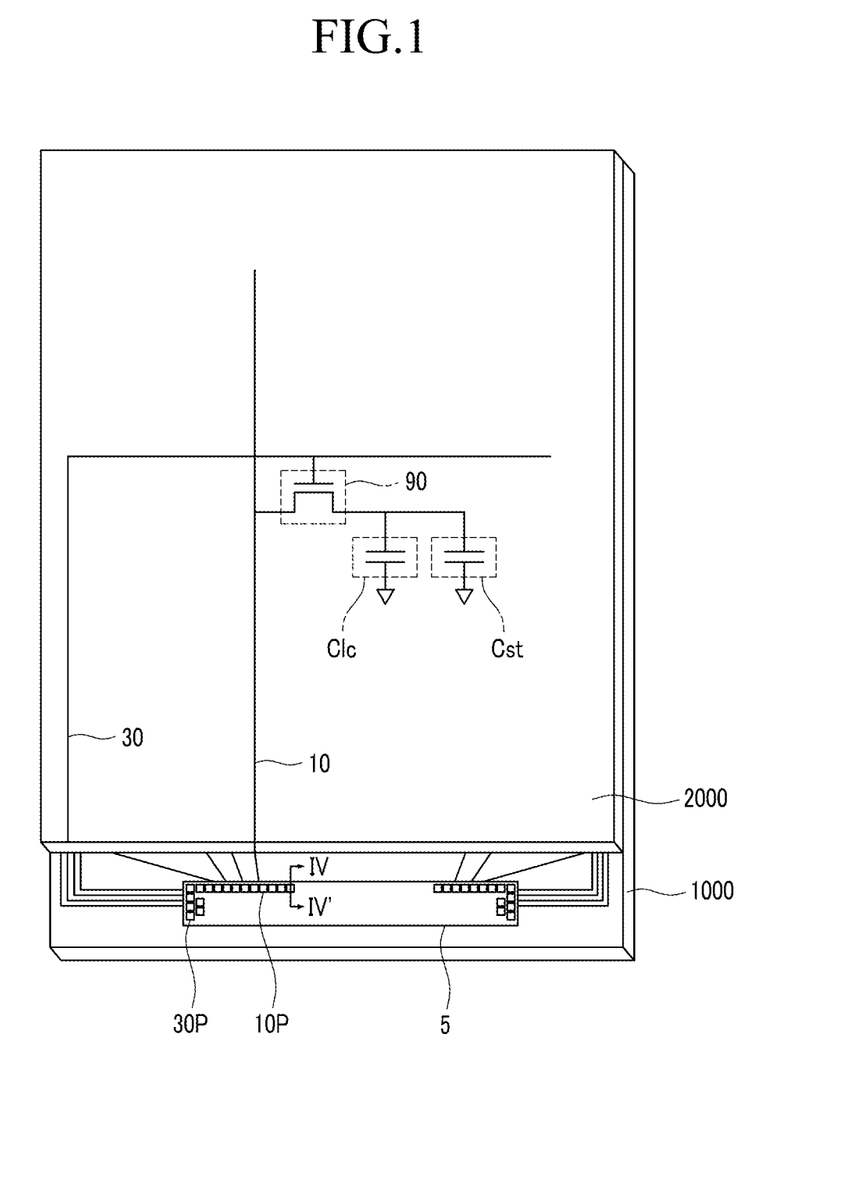
FIG. 1 is an outline perspective view of an exemplary embodiment of an LCD device according to the present invention.
Figure 2:
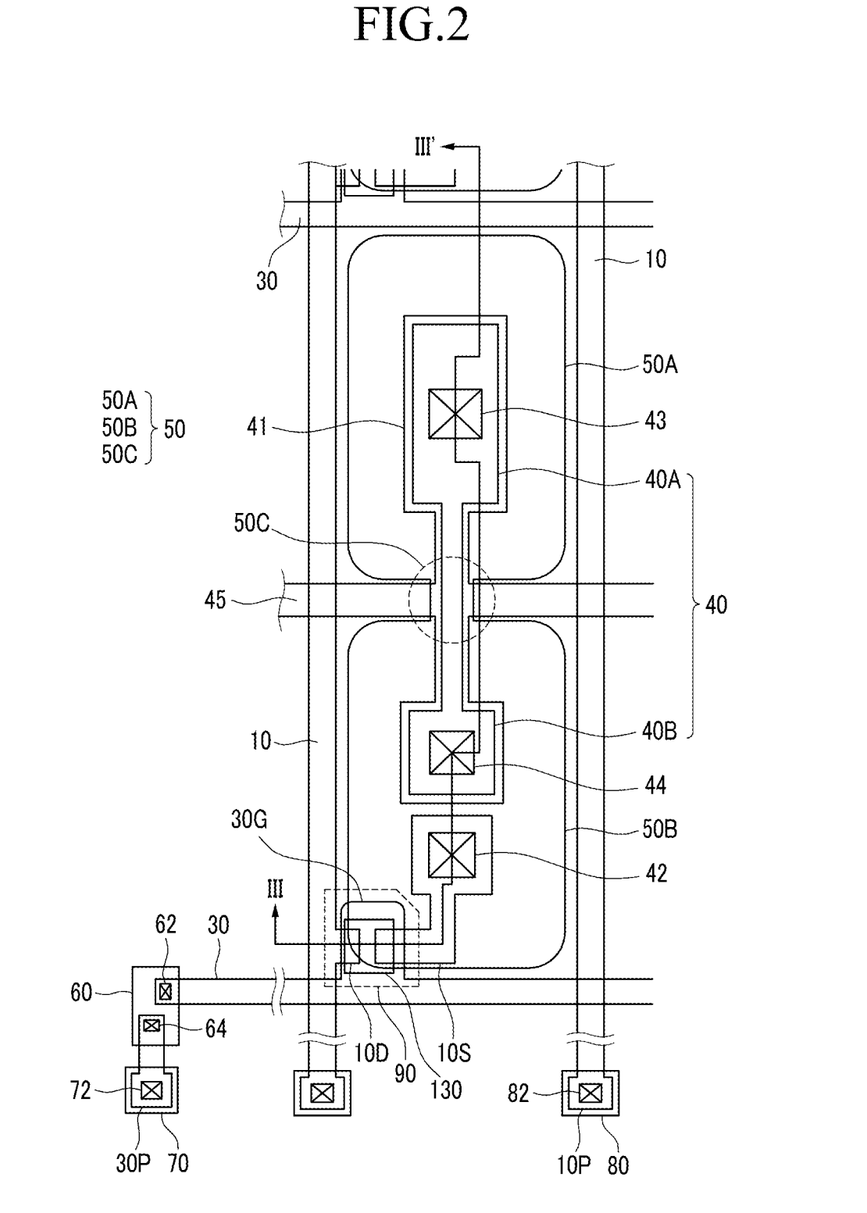
FIG. 2 is a plan view of an exemplary embodiment of a lower substrate of the LCD device in FIG. 1 according to the present invention.

FIG. 1 is an outline view of an exemplary embodiment of a relatively small sized liquid crystal display ("LCD") device, and FIG. 2 is a plan view of an exemplary embodiment of a lower substrate of the LCD device, according to an exemplary embodiment of the present invention.

Figure 3:
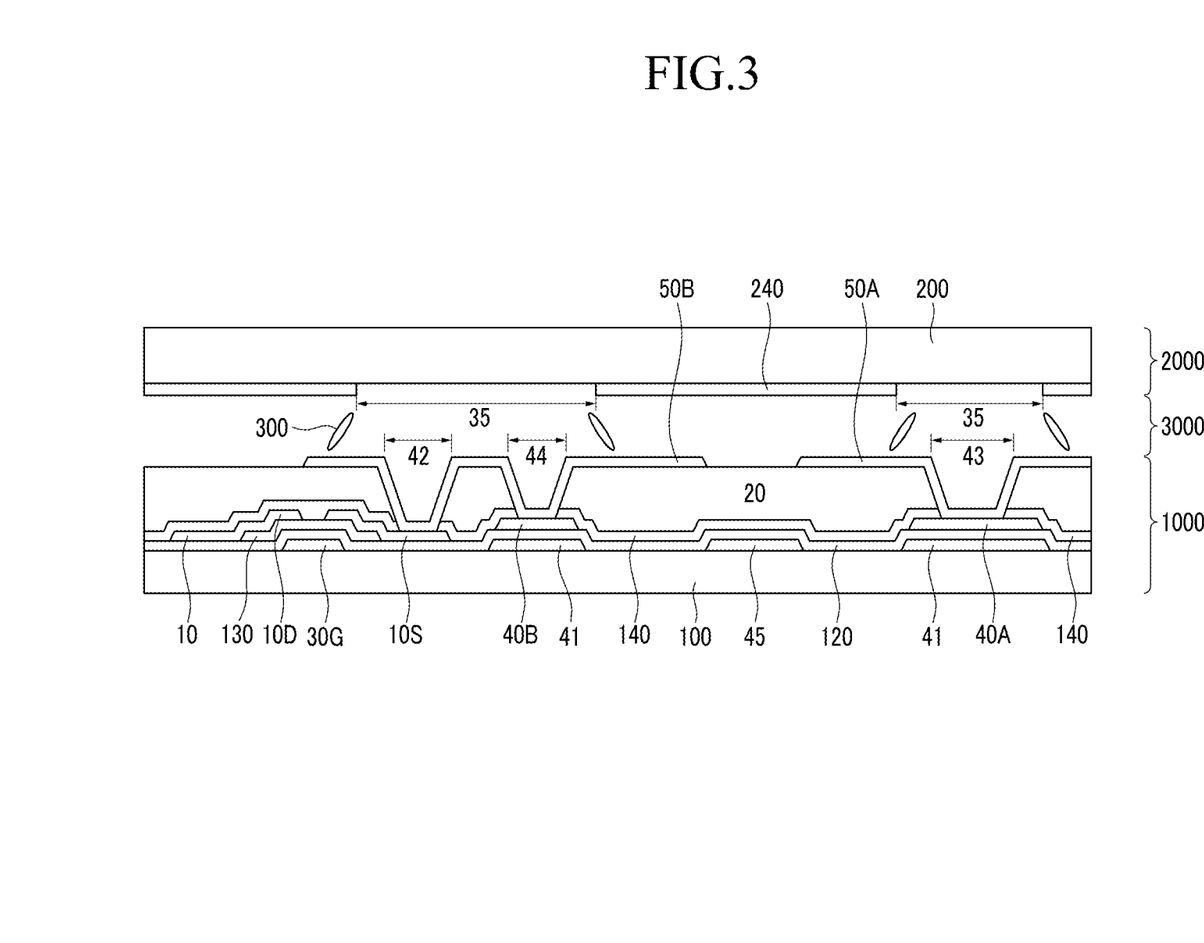
FIG. 3 is a cross-sectional view of the LCD device taken along line III-III' in FIG. 2.

Referring to FIG. 1, the lower substrate 1000 includes a plurality of gate lines 30 and a plurality of data lines 10, and a plurality of pixel electrodes 50 (illustrated in FIG. 2) electrically connected to the data lines 10 via a switching element 90, and the upper substrate 2000 includes a common electrode 240 (illustrated in FIG. 3).

A liquid crystal capacitor Clc includes two electrodes, which are the pixel electrode 50 of the lower substrate 1000 and the common electrode 240 of the upper substrate 2000. A liquid crystal layer 3000 is interposed between the pixel electrode 50 and the common electrode 240. The pixel electrode 50 is electrically connected to the switching element 90, and the common electrode 240 may be disposed commonly on the surface of the upper substrate 2000. A common voltage Vcom is applied to the common electrode 240.

A storage capacitor Cst, which supplements the liquid crystal capacitor Clc, also includes two electrodes. The storage capacitor Cst includes a first capacitor electrode 40 electrically connected to the pixel electrode 50, and a second capacitor electrode 41 electrically connected to a capacitor line 45. A gate insulation layer 120 is interposed between the first capacitor electrode 40 and the second capacitor electrode 41. A fixed voltage, such as the common voltage Vcom, is applied to the capacitor line 45. The first capacitor electrode 40 is disposed separately from a source electrode 10S of the switching element 90.

A COG pad includes a gate pad 30P electrically connected to the gate line 30, and a data pad 10P electrically connected to the data line 10. In an exemplary embodiment, the gate pad 30P and the data pad 10P are made of the same conductive material as the gate line 30 and/or the data line 10 of the lower substrate 1000. As illustrated in FIG. 1, both the gate pad 30P and data pad 10P are attached to an integrated circuit ("IC") chip 5, such as in a type of COG (chip-on-glass) structure, so that the same level of pads (gate pad 30P, data pad 10P) is desired. That is, the gate pad 30P and the data pad 10P are disposed on a same layer or level, which is the IC chip 5.

Referring to FIG. 2, gate lines 30 transmit gate signals and data lines 10 transmit data signals. The gate lines 30 extend substantially in a row direction (e.g., horizontally in the view of FIG. 2) and are disposed substantially parallel to one another. The data lines 10 extend substantially in a column direction (e.g., vertically in the view of FIG. 2) and are disposed substantially parallel to one another. The row and the column direction are disposed substantially perpendicular to each other.

In an exemplary embodiment, each of a plurality of the switching elements 90 is a three terminal element, such as a thin film transistor, which is disposed on the lower substrate 1000. Each switching element 90 may include a gate electrode 30G connected to the gate line 30, a drain electrode 10D connected to the data line 10, and the source electrode 10S connected to the pixel electrodes 50.

Each of the plurality of pixel electrodes 50 includes a first portion 50A, a second portion 50B and a connection portion 50C. The connection portion 50C is disposed and directly connected between the first portion 50A and the second portion 50B of a pixel electrode 50. The first portion 50A, the second portion 50B and the connection portion 50C form a single and continuous unit.

The first portion 50A and/or the second portion 50B may be substantially a same shape, or may be different shapes. In an exemplary embodiment, a plan view of the first portion 50A and/or the second portion 50B may have a substantially an oval shape, a rectangular shape with chamfered edges, a circular shape, or any other shape suitable for the LCD device.

The connection portion 50C is disposed between the first portion 50A and the second portion 50B, substantially parallel to an extension direction of the first capacitor electrode 40. A width of the connection portion 50C taken in the horizontal direction is smaller than a width of the first portion 50A and the second portion 50B.

As shown in the plan view of FIG. 2, the connection portion 50C overlaps a portion of the first capacitor electrode 40. The width of the connection portion 50C is larger than a width of the portion of the first capacitor electrode 40, such that an entire of the width of the portion of the first capacitor electrode 40 is overlapped by the connection portion 50C.

The first capacitor electrode 40 includes a first extension part 40A, and a second extension part 40B corresponding to the first portion 50A and the second portion 50B, respectively. As used herein, "corresponding" indicates substantially similar in dimension or positional placement. As shown in FIGS. 2 and 3, a whole of both the first extension part 40A and the second extension part 40B are completely overlapped by the first portion 50A and the second portion 50B, respectively. A second contact hole 43 and a third contact hole 44 are arranged on the first extension part 40A and the second extension part 40B, respectively. The pixel electrode 50 and the first capacitor electrode 40 are electrically connected at the second and third contact holes 43 and 44.

Referring again to the plan view of FIG. 2, the first capacitor electrode 40 may be a nonsymmetrical dumbbell shape of an island type, which may be disposed separately from the source electrode 10S. An area of the first extension part 40A is a different size than the second extension part 40B, forming the nonsymmetrical shape described above. The first extension part 40A and the second extension part 40B may also be connected by a connection portion, disposed between the first extension part 40A and the second extension part 40B. The first extension part 40A, the second extension part 40B and the connection part of the first capacitor electrode 40 are a single and continuous member.

A second capacitor electrode 41 is electrically connected to the capacitor line 45 and has substantially the same shape as the first capacitor electrode 40. The second capacitor electrode 41 may also include first and second extension parts connected by a connection portion to form a single and continuous member. In an exemplary embodiment, the second capacitor electrode 41 may be sufficiently larger (e.g., in area in a plan view) but have substantially the same shape as the first capacitor electrode 40, so that a desired capacitance can be obtained in spite of misalignment of the first and second capacitor electrodes 40 and 41.

A capacitor line 45 passes under the connection portion 50C and partially overlaps edges of the first portion 50A and the second portion 50B. Referring to FIG. 3, "under" is used to indicate in a lower (layer) position taken in a vertical direction of the cross-sectional view. The capacitor line 45 is disposed integrally with the second capacitor electrode 41. As used herein, "integral" indicates formed uninterrupted as a single and continuous member.

Referring to FIG. 2, the gate pad 30P is electrically connected to the gate line 30 by a bridge conductive pattern 60 via contact holes 64 and 62, and the data pad 10P is directly connected to the data line 10. Where the data pad 10P is directly connected to the data line 10, the data pad 10P is part of a single and continuous member with the data line 10. Alternatively, the gate pad 30P may be directly connected to the gate line 30 and the date pad 10P may be connected to the data line 10 through a bridge conductive pattern (not shown). As a result, the pads 30P and 10P are disposed on the same level, e.g., layer of the lower substrate 1000.

A first auxiliary gate pad 70 is electrically connected to the gate pad 30P, and a second auxiliary data pad 80 is electrically connected to the data pad 10P. In an exemplary embodiment, the first auxiliary gate pad 70 and the second auxiliary data pad 80 may be made of the same material as the pixel electrode 50. The first auxiliary gate pad 70 and the second auxiliary data pad 80 are connected to the gate pad 30P and the data pad 10P, respectively, through first pad contact hole 72 and second pad contact hole 82 penetrating the gate insulation layer 120.

FIG. 3 is a cross-sectional view of the LCD device taken along line III-III' in FIG. 2.

Referring to FIG. 3, the pixel electrode 50 of the lower substrate 1000, is disposed on a first substrate 100, and is electrically connected to the source electrode 10S through a first contact hole 42, the first extension part 40A through the second contact hole 43, and the second extension part 40B through the third contact hole 44. The first, second and third contact holes 42, 43 and 44 extend through an organic insulation pattern 20 and a protection layer 140. In an exemplary embodiment, the organic insulation pattern 20 may be a color filter.

A plurality of opening patterns 35 are disposed in the common electrode 240 disposed on a second substrate 200 of the upper substrate 2000. The opening patterns 35 are disposed in regions corresponding to the first portion 50A and the second portion 50B of the pixel electrode 50. An entire of the opening patterns 35 may be completely overlapped by the first portion 50A and the second portion 50B of the pixel electrode 50. Both of the first and third contact holes 42 and 44 may be located inside a same (first) one of the opening patterns 35, such that a whole of the first and third contact holes 42 and 44 is overlapped by a single respective opening pattern 35, as shown in FIG. 3. The second contact hole 43 may be located inside (e.g., overlapped by) another (e.g., second) one of the opening patterns 35. In an exemplary embodiment, the opening patterns 35 may have an oval shape, a diamond shape, a circular shape or any other shape in a plan view suitable for the LCD device. As illustrated in FIG. 3, the opening patterns 35 may be disposed substantially in a center of the first and/or second portions 50A and 50B of the pixel electrode 50.

An orientation of liquid crystal molecules 300 disposed adjacent to or around the first, second and third contact holes 42, 43 and 44 may not be controlled well. Also, the liquid crystal molecules 300 disposed around the opening patterns 35 may not be controlled well. As a result, undesirable regions of the LCD device, which do not contribute to displaying images, may be decreased by covering or blocking light for regions of the not well controlled liquid crystal molecules 300. Advantageously, the LCD device may decrease the light leakage of a LCD panel and have a high aperture ratio for transmitting more light from a backlight.

The liquid crystal layer 3000 is interposed between the common electrode 240 and the pixel electrode 50. The liquid crystal molecules 300 may have a negative dielectric anisotropy and be oriented vertically to the common electrode 240 and the pixel electrode 50 when the voltage between electrodes 240 and 50 is not applied, so that the LCD device can be operated in a normally black mode. In an exemplary embodiment, the liquid crystal layer 3000 may be doped with a chiral dopant.

In addition, a black matrix and/or a color filter (not shown) may be disposed directly between the second substrate 200 and the common electrode 240, and directly contact one or both of the second substrate 200 and the common electrode 240.

Figure 4:
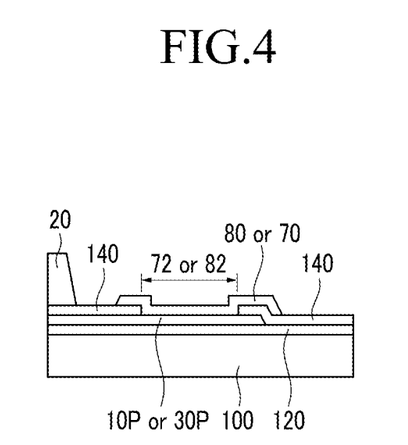
FIGS. 4 to 5 are exemplary embodiments of cross-sectional views of the chip on glass ("COG") PAD taken along line IV-IV' in FIG. 1.
Figure 5:
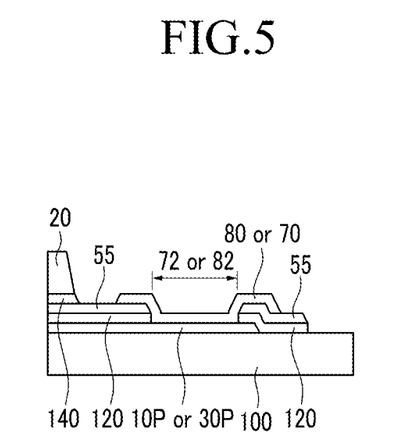

FIGS. 4 to 5 are exemplary embodiments of cross-sectional views of the COG pad taken along line IV-IV' in FIG. 1.

In an exemplary embodiment, a relatively small sized LCD device uses a single IC chip 5, including a gate driver circuit and a data driver circuit. It is preferable that the gate pad 30P and the data pad 10P are disposed in the same level or layer, because both the gate pad 30P and the data pad 10P are connected to the same IC chip 5. To dispose the gate pad 30P and the data pad 10P in the same level, one of the gate pad 30P and the data pad 10P is electrically connected to the gate line 30 or the data line 10, respectively, through a bridge conductive pattern 60 (FIG. 2).

Referring to FIGS. 2 and 4, as an exemplary embodiment of a COG pad, a pad contact hole 82 or 72 penetrates the protection layer 140 and exposes the data pad 10P or the gate pad 30P, respectively.

An auxiliary pad 80 or 70 is connected to the data pad 10P or the gate pad 30P, respectively, through the pad contact hole 82 or 72. The auxiliary pad 80 or 70 may be made of the same material as the pixel electrode 50.

The organic insulation pattern 20 is removed at a pad area where the IC chip 5 is connected to the auxiliary pad 80 or 70. It is preferable that the organic insulation pattern 20 is removed at the pad area, since it may be difficult to otherwise use a portion covered with an organic insulation pattern 20 as the pad area bonded with an IC chip 5, because an organic insulation pattern 20 decreases reliability during the bonding process.

Referring to FIG. 5, as another exemplary embodiment of a COG pad, a pad contact hole 82 or 72 penetrates the gate insulation layer 120 and an auxiliary pattern 55. The embodiment shown in FIG. 5 is different from that of FIG. 4 as including the auxiliary pattern 55 disposed between the protection layer 140 and the gate insulation layer 120, and directly contacting distal ends (e.g. boundaries) of the auxiliary pad 80 or 70. In FIG. 5, the data pad 10P and the gate pad 30P directly contact the first substrate 100, where in FIG. 4, the gate insulation layer 120 is disposed between the data pad 10P and the gate pad 30P, and the first substrate 100.

As illustrate in FIG. 5, the gate insulation layer 120 can be removed in areas proximate to the pad area where the auxiliary pattern 55 is not disposed and the protection insulation layer 140 and the organic insulation pattern 20 may be removed from an entire of the pad area.

The auxiliary pattern 55, which is used as a mask for forming the contact holes 72 or 82. In an exemplary embodiment, the auxiliary pattern 55 may be formed substantially simultaneously with a semiconductor pattern 130 (FIGS. 2 and 3) or the data line 10. The auxiliary pattern 55 may be disposed around, or adjacent to all sides of a respective contact hole 72 or 82, such as in a plan view.

By using the auxiliary pattern 55, the organic insulation pattern 20 may be efficiently removed from around the COG pad. In one exemplary embodiment, when forming a contact hole exposing a source electrode, the organic insulation pattern 20 and protection insulation layer 140 are removed from the pad region by using the auxiliary pattern 55 as an etch stopper. Subsequently, the gate insulation layer 120 is removed along with removing the protection insulation layer 140, by using the auxiliary pattern 55 as an etch stopper, to form the contact holes 72 and 82.

FIGS. 6 to 10 are cross-sectional views of the lower substrate in FIG. 3 and the COG pad in FIG. 4 for illustrating an exemplary embodiment of a method for manufacturing a display device according to the present invention.

Figure 6:
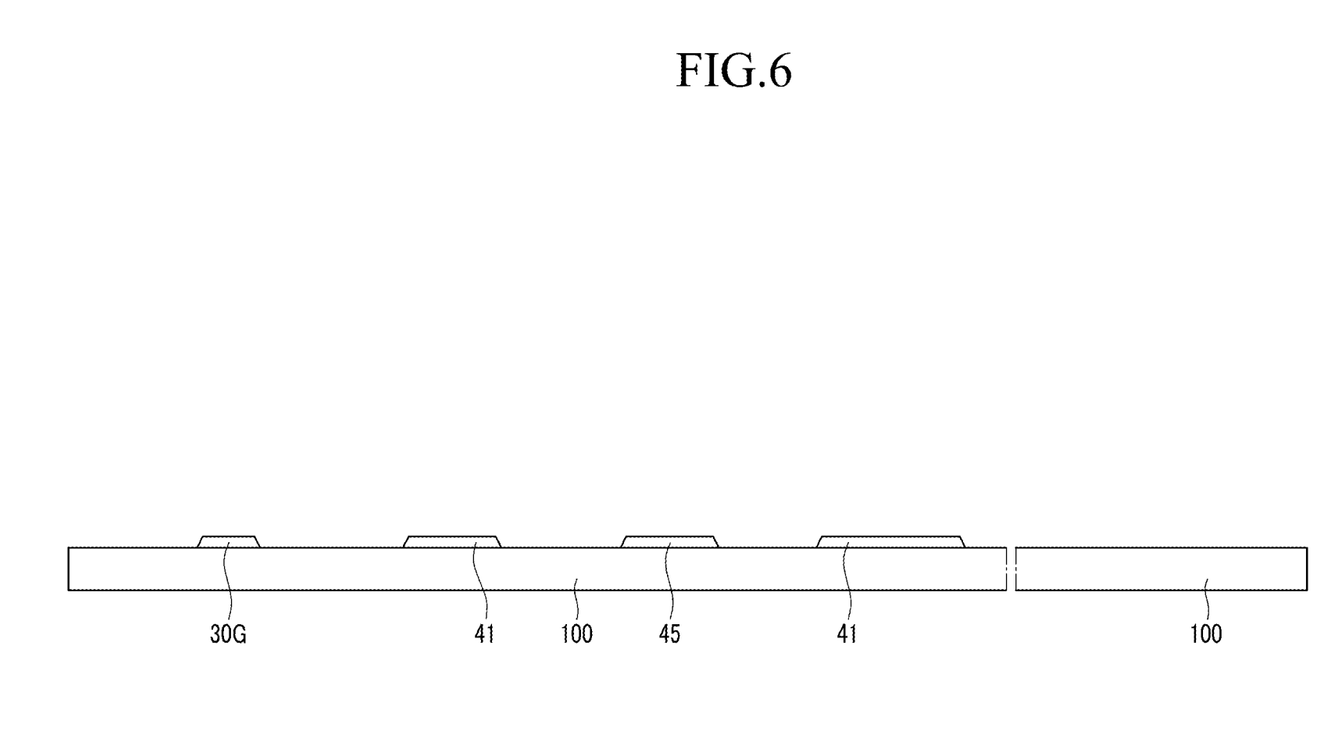
FIGS. 6 to 10 are cross-sectional views of the lower substrate in FIG. 3 and the COG pad in FIG. 4, illustrating an exemplary embodiment of a method for manufacturing a LCD device.

Referring to FIG. 6, a chromium (Cr) layer, a molybdenum (Mo) layer, a titanium (Ti) layer, a aluminum (Al) layer, an alloy layer thereof or combination layers thereof, is formed on a first substrate 100 by a deposition method, such as sputtering, and patterned, such as through photolithography, to thereby form a gate line 30 including a gate electrode 30G, a second capacitor electrode 41 and a capacitor line 45. In one exemplary embodiment, the gate line 30 and the gate electrode 30G are formed with three layers of Ti/Al/Ti or Mo/Al/Mo, or two layers of Al/Ti or Al/Mo.

Figure 7:
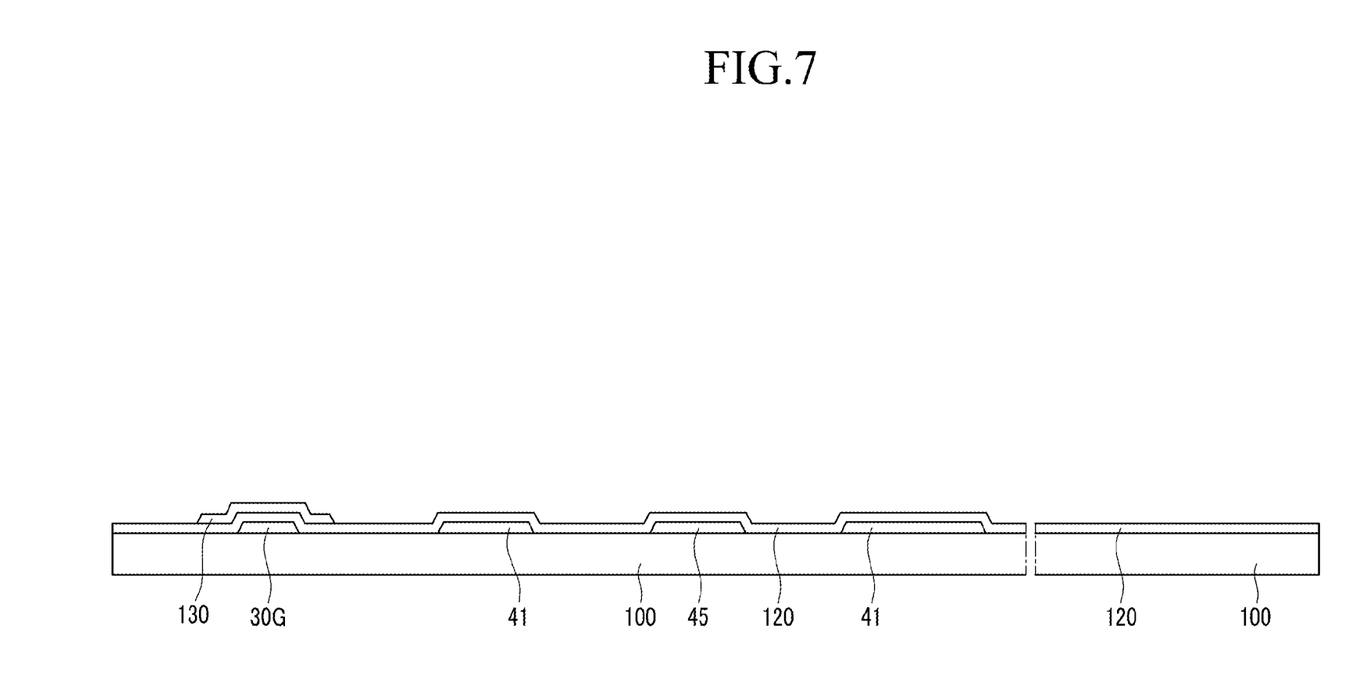

Referring to FIG. 7, a gate insulation layer 120 and a semiconductor layer are sequentially formed on the first substrate 100 and the gate electrode 30G by a deposition method, such as plasma enhanced chemical vapor deposition ("PECVD"). The gate insulating layer 120 may directly contact the first substrate 100. Subsequently, the semiconductor layer is etched through photolithography to thereby form a semiconductor pattern 130 on the gate electrode 30G.

In an exemplary embodiment of the present invention, the gate insulation layer 120 may be formed of a silicon nitride, and the semiconductor pattern 130 may include an amorphous silicon layer and/or a doped amorphous silicon layer.

Figure 8:
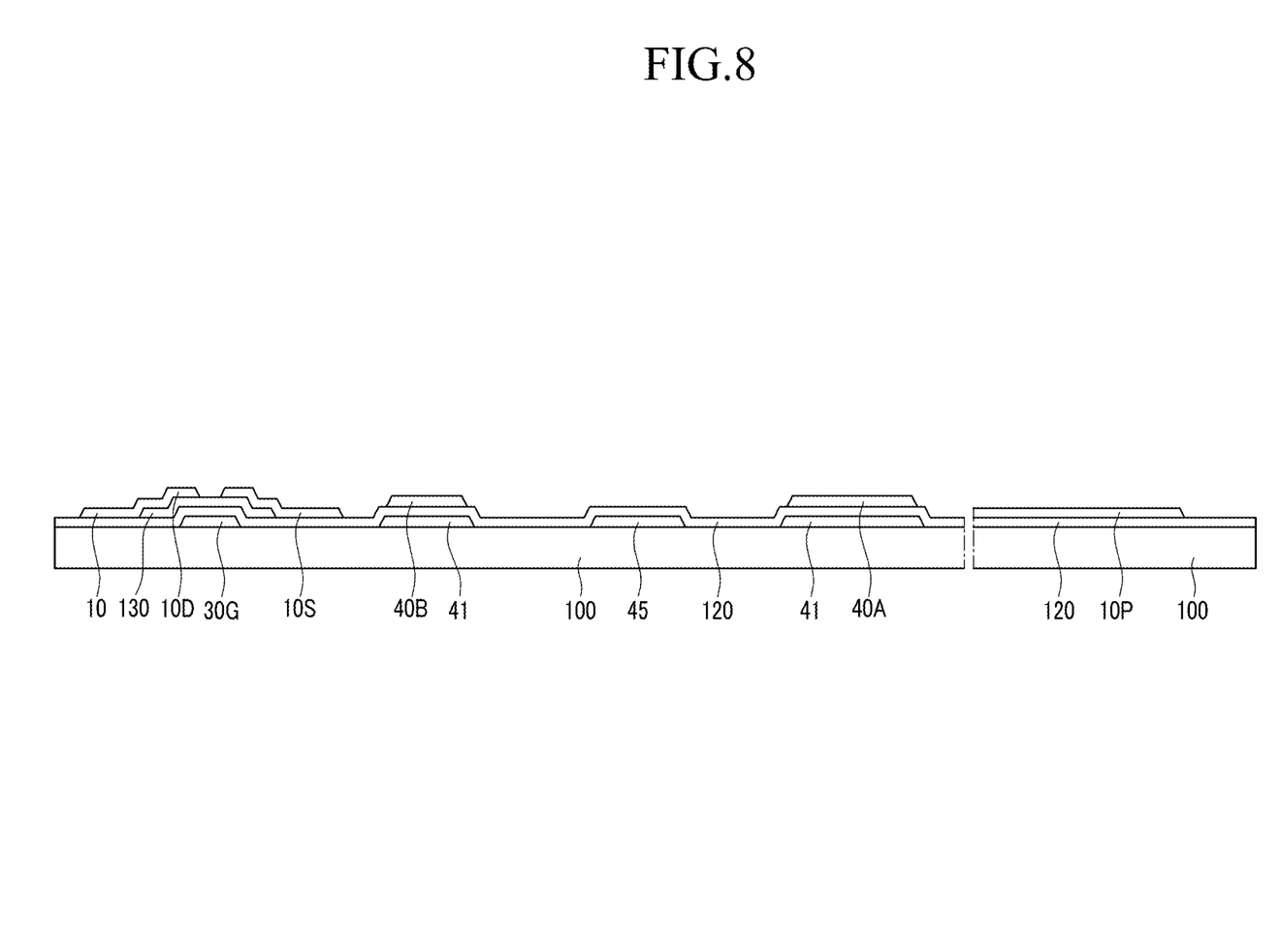

Referring to FIG. 8, a Cr layer, a Mo layer, a Ti layer, a Al layer, an alloy layer thereof or combination layers thereof is formed on the gate insulation layer 120 and the semiconductor pattern 130 by a deposition method, such as sputtering, and is subsequently patterned, such as through photolithography, to thereby form a data line 10 including a drain electrode 10D and a data pad 10P, a source electrode 10S, and a first capacitor electrode 40. In one exemplary embodiment, the data line 10 is formed with three layers of Ti/Al/Ti or Mo/Al/Mo, or two layers of Al/Ti or Al/Mo.

Figure 9:
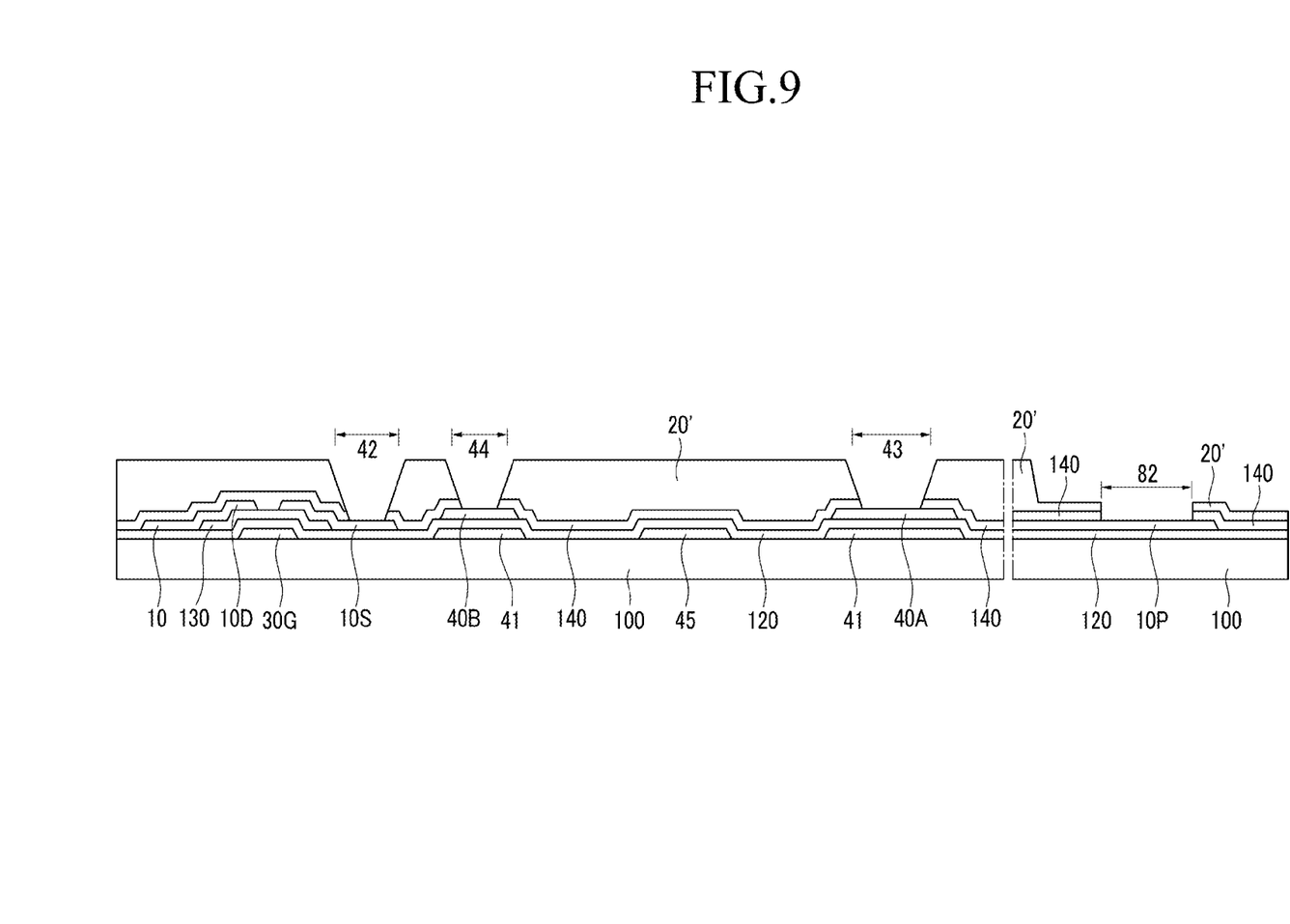

Referring to FIG. 9, a protection layer 140 is deposited on and directly contacting the data line 10, the first capacitor electrode 40, the data pad 10P, the gate insulation layer 120, and the gate pad 30P. an organic insulation layer is then sequentially formed on the protection layer 140. Thereafter, the organic insulation layer is patterned to form an organic insulation pattern 20' and to expose the protection layer 140.

The organic insulation pattern 20' has two different heights, as shown in FIG. 9. A first (higher) portion of the organic insulation pattern 20' is formed at a pixel region, and a second (lower) portion is formed at a COG pad region, shown with second pad contact hole 82 in FIG. 9. The two different heights of the organic insulation pattern 20' may be formed by a slit mask or half tone mask technology of photolithography, in which a source light is illuminated discriminately depending on the mask for one "shot." The organic insulation pattern 20' with a lower height at a COG pad region is formed directly on the protection layer 140 and disposed around the second pad contact hole 82. As used herein, "around" indicates surrounding or disposed on all sides, such as in a plan view.

The earlier exposed protection layer 140 is also removed to expose the source electrode 10S, the first capacitor electrode 40 and the data pad 10P, thereby forming the first, second and third contact holes 42, 43, 44 and the second pad contact hole 82.

In an exemplary embodiment of the present invention, the protection layer 140 may be formed of the same material as a color filter, or is formed of a silicon nitride, a silicon oxide (SiOx) or low dielectric material, such as SiOC or SiOF.

Figure 10:
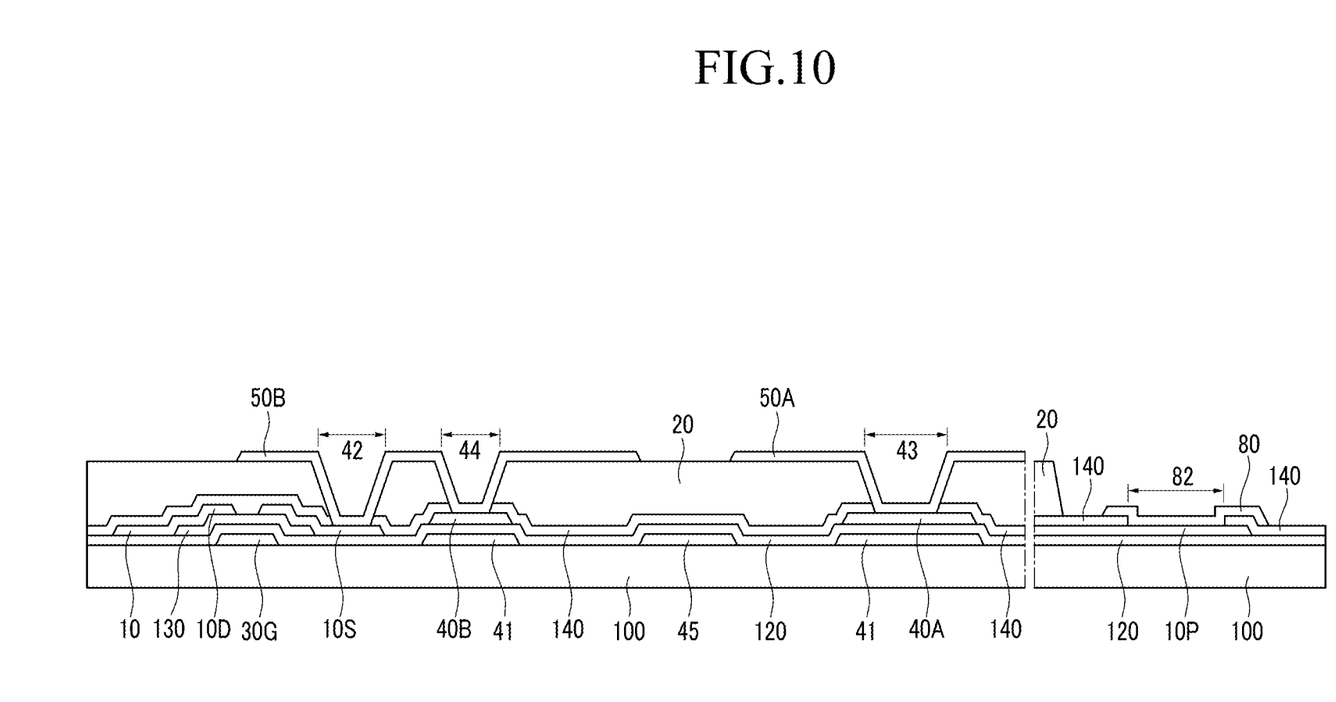

Referring to FIG. 10, the organic insulation pattern 20' with the two different heights is partially removed. The thickness of the organic insulation pattern 20' is entirely reduced to thereby form an organic insulation pattern 20 having a substantially uniform thickness, and exposing a portion of the protection layer 140 disposed on the COG pad region. In an exemplary embodiment, if the organic insulation pattern 20' is made of a color filter material, the organic insulation pattern 20 may be the color filter itself.

Then the transparent conductive layer is formed and it is photo-etched to thereby form a pixel electrode 50 and an auxiliary pad 80. At substantially a same time, a bridge conductive pattern 60 and an auxiliary gate pad 70 may also be formed.

In an alternative embodiment, protrusion patterns may be used instead of the opening patterns 35.

While the invention has been shown and described with reference to exemplary embodiments thereof, it will be understood by those skilled in the art that various changes in form and details may be made therein without departing from the spirit and scope of the invention as defined by the appended claims.

What is claimed is:

1. A display device comprising:
   a first substrate;
   a pixel electrode disposed on the first substrate, the pixel electrode comprising a first portion, a second portion, and a connection portion disposed between the first and second portions, the connection portion being continuous with the first and second portions;
   a capacitor line disposed on the first substrate, and disposed between the first substrate and the connection portion of the pixel electrode;
   a capacitor electrode disposed on the first substrate substantially in a dumbbell shape of an island type, and overlapping the pixel electrode and the capacitor line;
   an insulating layer including a first contact hole and a second contact hole, the insulating layer disposed between the capacitor electrode and the pixel electrode;
   a second substrate; and a common electrode disposed on the second substrate, and comprising a first opening pattern and a second opening pattern overlapping the first portion and the second portion of the pixel electrode, respectively, wherein the pixel electrode is electrically connected to the capacitor electrode through both the first and second contact holes.

2. The display device of claim 1, wherein the first contact hole overlaps the first portion of the pixel electrode, and the second contact hole overlaps the second portion of the pixel electrode.

3. The display device of claim 2, wherein a whole of the first contact hole and the second contact hole is overlapped by the first opening pattern and the second opening pattern of the common electrode, respectively.

4. The display device of claim 1, the connection portion extended between the first portion and the second portion of the pixel electrode, is extended substantially parallel to a longitudinal extension of the capacitor electrode.

5. The display device of claim 4, further comprise an organic insulation pattern disposed on the first substrate and directly contacting a lower surface of the pixel electrode.

6. The display device of claim 5, wherein the organic insulation pattern is a color filter.

7. The display device of claim 1, further comprising
a switch element electrically connected to the pixel electrode;
a pad electrically connected to the switch element, the pad transmitting a signal to the switch element;
an auxiliary pad connected to the pad through a pad contact hole of the insulating layer, and
an auxiliary pattern disposed surrounding the pad contact hole in a plan view.

8. The display device of claim 1, wherein the capacitor electrode is a nonsymmetrical dumbbell shape, in a plan view.

* * * * *